United States Patent [19]

Kahen et al.

[11] Patent Number: 5,212,705
[45] Date of Patent: May 18, 1993

[54] ALAS ZN-STOP DIFFUSION LAYER IN ALGAAS LASER DIODES

[75] Inventors: Keith B. Kahen, Rochester; Frank T. J. Smith, Pittsford, both of N.Y.

[73] Assignee: Eastman Kodak Company, Rochester, N.Y.

[21] Appl. No.: 836,571

[22] Filed: Feb. 18, 1992

[51] Int. Cl.$^5$ .............................................. H01S 3/19
[52] U.S. Cl. ....................................... 372/46; 372/45
[58] Field of Search .................................. 372/45, 46

[56] References Cited

U.S. PATENT DOCUMENTS

| | | | |
|---|---|---|---|
| 4,426,703 | 1/1984 | Kuroda et al. | 372/46 |
| 4,731,789 | 3/1988 | Thornton | 372/45 |
| 5,166,945 | 11/1992 | Arimoto | 372/46 |

OTHER PUBLICATIONS

F. T. J. Smith, "Zinc diffusion in AlGaAs", Proceedings of the 13th State-of-the-Art Program on Compound Semiconductors, Electrochemical Society, Pennington, 1991, pp. 274-280.
Y-R Yuan, E. Kazuo, G. A. Vawter, and J. L. Merz, J. Appl. Phys., vol. 54, 6044, 1983.
V. Quintana, J. J. Clemencon, and A. K. Chin, J. Appl. Phys., vol. 63, 2454, 1988.

*Primary Examiner*—James W. Davie
*Attorney, Agent, or Firm*—Raymond L. Owens

[57] ABSTRACT

An AlGaAs-based semiconductor laser diode is disclosed which has a Zn-stop diffusion layer of p-type conductivity deposited on the active layer, having an Al content greater than 85%.

6 Claims, 2 Drawing Sheets

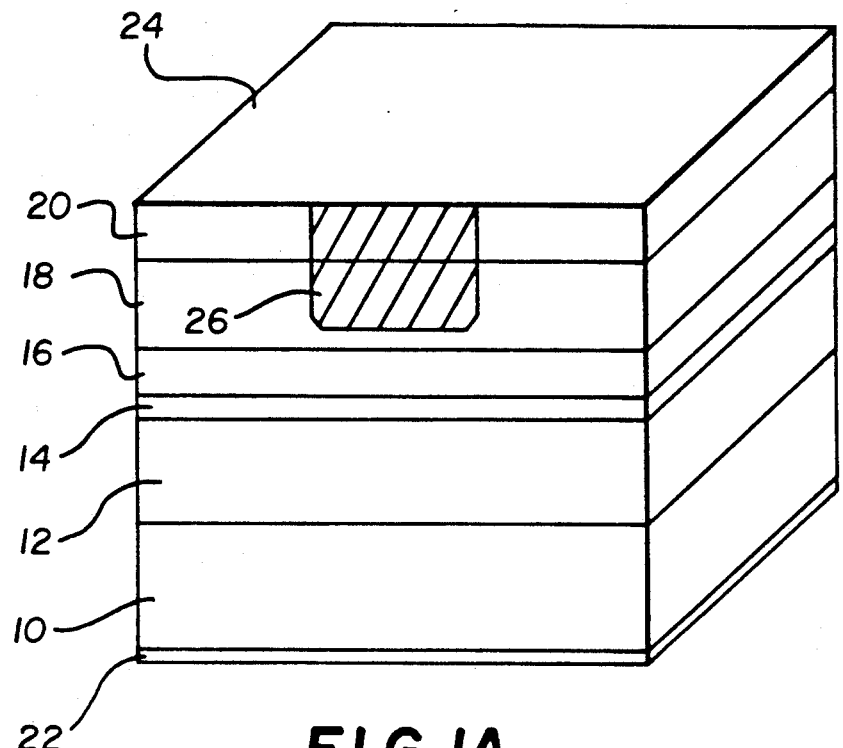
FIG. IA
*(PRIOR ART)*
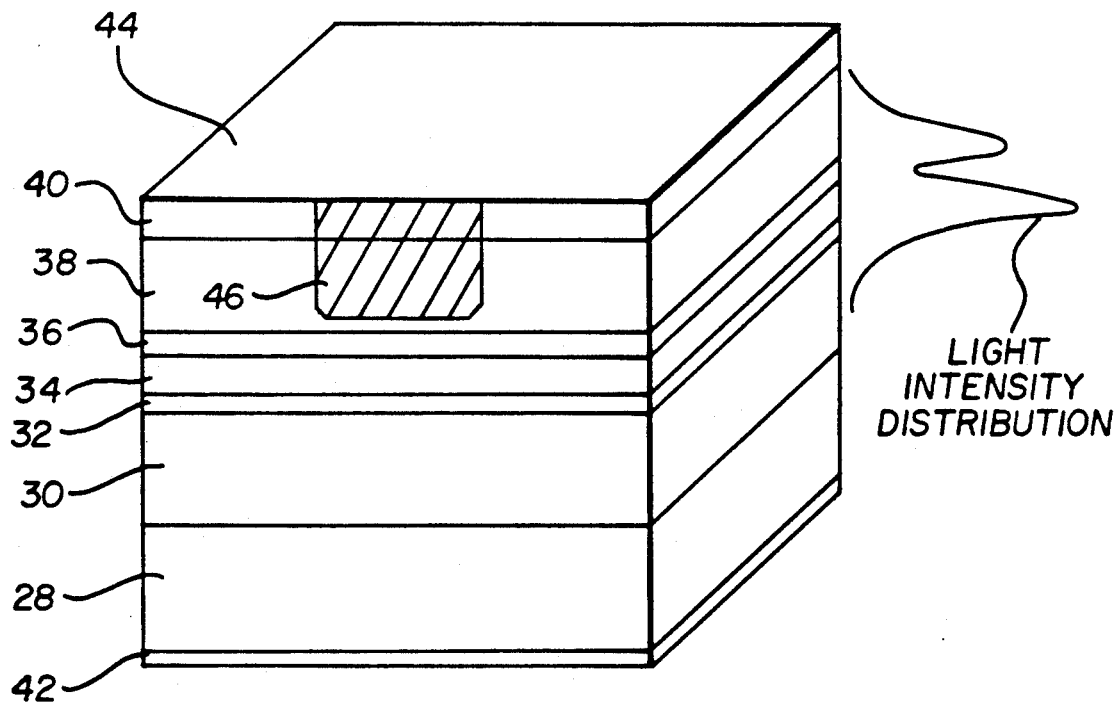
FIG. IB
*(PRIOR ART)*

ALAS ZN-STOP DIFFUSION LAYER IN ALGAAS LASER DIODES

FIELD OF THE INVENTION

The present invention relates to AlGaAs-based semiconductor laser diodes.

BACKGROUND OF THE INVENTION

In semiconductor diode lasers, Zn diffusion is typically used to provide a selective low resistance path from the p-metal contact to the active layer. As a result, it is desirable to have the Zn diffusion stop just short of the active layer; otherwise, overdiffusion can result in displacing the p-n junction away from the active layer. Typically, the nominal diffusion depth is obtained by making practice diffusion runs on the edges of one of the laser diode wafers. This method is practical only if the p-side layer thicknesses and compositions do not vary from wafer to wafer or across a specific wafer. However, experience shows that these conditions are generally invalid and the resulting Zn diffusion depths are difficult to control.

One possibility for controlling the diffusion depth is to place an additional layer (a Zn-stop diffusion layer) adjacent to or nearby the active layer through which Zn has a slower diffusion rate than in the p-AlGaAs cladding layer. FIG. 1a provides an illustration of an AlGaAs semiconductor laser diode which includes a Zn-stop diffusion layer. Upon a n+-GaAs substrate 10, there is grown a n-AlGaAs cladding layer 12. On the surface of layer 12 is formed a GaAs active layer 14. Upon layer 14 is formed a p-AlGaAs Zn-stop diffusion layer 16. On the surface of layer 16 is formed the p-AlGaAs cladding layer 18. Upon layer 18 is grown the p-GaAs capping layer 20. Ohmic metals 22 and 24 are deposited on layers 10 and 20, respectively. Using standard diffusion techniques, Zn is diffused into this structure from the top, forming region 26, penetrating, at minimum, into the p-AlGaAs cladding layer. Since Zn diffuses relatively quickly through the p-AlGaAs cladding layer and slowly through the Zn-stop diffusion layer, it becomes simpler to control the Zn diffusion process. U.S. Pat. No. 4,426,703 and U.S. Pat. No. 4,731,789 teach that the Zn diffusivity is an increasing function of the material's Al content (the percentage of Al in AlGaAs, by numbers of atoms). Consequently, p-AlGaAs cladding layers having greater than 40% Al content and Zn-stop diffusion layers of approximately $Al_{0.15}Ga_{0.85}As$ are taught.

As shown in FIG. 1b is another prior art laser diode having an n+-GaAs substrate 28, on which is grown a n-AlGaAs cladding layer 30. On the surface of layer 30 is formed a GaAs active layer 32, upon which is formed a $p-Al_{0.35}Ga_{0.65}As$ blocking layer 34. Upon layer 34 is formed the $p-Al_{0.15}Ga_{0.85}As$ Zn-stop diffusion layer 36. On the surface of layer 36 is formed the $p-Al_{0.45}Ga_{0.55}As$ cladding layer 38. Upon layer 38 is grown a p-GaAs capping layer 40. Ohmic metals 42 and 44 are formed on layers 28 and 40, respectively. Again, using standard diffusion techniques, Zn is diffused into this structure from the top, forming region 46, penetrating, at minimum, into the $p-Al_{0.45}Ga_{0.55}As$ cladding layer. A problem with the above two designs is that the usage of Zn-stop diffusion layers of low Al-content degrades the performance of laser diodes. If this layer is placed adjacent to the active layer (as in FIG. 1a), then the electrons flowing from the n+-GaAs substrate are more easily able to surmount the active layer-$p-Al_{0.15}Ga_{0.85}As$ potential barrier (since the barrier height is smaller for low Al-content layers), resulting in less stimulated emission in the active layer. If this layer is sandwiched between the $p-Al_{0.35}Ga_{0.65}As$ blocking layer and the $p-Al_{0.45}Ga_{0.55}As$ cladding layer (FIG. 1b), then, on account of its index of refraction being larger than that of the surrounding layers, a local peak in the light intensity distribution, centered in the Zn-stop diffusion layer, will be formed (see light intensity distribution accompanying FIG. 1b). Formation of this additional peak results in undesirable output beam qualities and lowers the optical confinement factor in the active layer (leading to higher threshold currents).

SUMMARY OF THE INVENTION

In this patent we incorporate in an AlGaAs laser diode a Zn-stop diffusion layer having a high Al-content, instead of a low Al content. Changing to a high Al content results in a more effective Zn-stop diffusion layer, with none of the aforementioned problems with low barrier heights and loss of optical confinement. Consequently, the Zn-stop diffusion layer can be placed either adjacent to the active layer or sandwiched inside of the p-AlGaAs cladding layer, without any loss in laser diode performance. Thus, there is freedom in stopping the Zn diffusion anywhere within the p-AlGaAs cladding layer.

BRIEF DESCRIPTION OF THE DRAWINGS

FIGS. 1a and 1b show prior art AlGaAs-based laser diodes;

DETAILED DESCRIPTION OF THE PREFERRED EMBODIMENTS

The use of high Al-content Zn-stop diffusion layers results from the work of co-inventor Smith (F. T. J. Smith, 'Zinc diffusion in AlGaAs,' in the Proceedings of the 13th State-of-the-Art Program on Compound Semiconductors, Electrochemical Society, Pennington, 1991, pp. 274–280). Smith discovered while diffusing Zn into AlGaAs layers, that instead of the Zn diffusion rate increasing with Al content, it had the behavior illustrated in FIG. 2, with a peak in the diffusivity for $Al_{0.60}Ga0.40As$. What differentiates the work of Smith from previous workers (Y.-R. Yuan, E. Kazuo, G. A. Vawter, and J. L. Merz, J. Appl. Phys., vol. 54, 6044, 1983 and V. Quintana, J. J. Clemencon, and A. K. Chin, J. Appl. Phys., vol. 63, 2454, 1988) is that Smith took special care to avoid the oxidation of the AlGaAs layers, since the formation of a layer of Al-oxide acts as a diffusion barrier to Zn diffusion. In addition, since the Zn diffusion rate is a function of the doping of the AlGaAs layers, he took special precautions to monitor the doping of the AlGaAs layers and study its influence on the diffusivity. This doping effect becomes important for diffusions into AlGaAs layers since the concentration of electrically active impurities is a function of the Al content.

A preferred embodiment incorporates a high Al content Zn-stop diffusion layer in an AlGaAs-based semiconductor laser diode. As discussed above, the usage of a high-Al content Zn-stop diffusion layer results in the ability to control the Zn diffusion depth, without the concomitant loss in the laser diode's performance and output characteristics.

Figure 3:
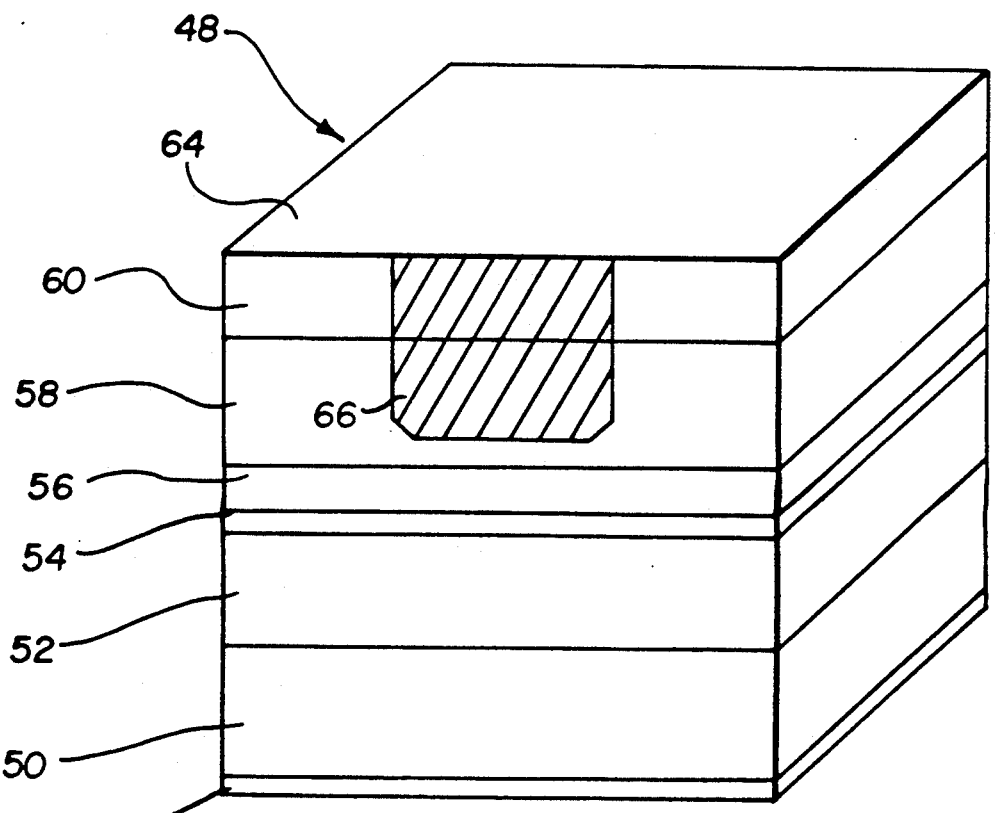
FIG. 3 is a laser diode structure according to this invention.

In accordance with this invention, FIG. 3 shows a semiconductor laser diode 48, having a high Al content Zn-stop diffusion layer 56. In the figure, 50 refers to the n+-GaAs substrate. The remaining sections of the laser are a series of individual semiconductive layers of predetermined thicknesses and doping types, arranged epitaxially on the n+-GaAs substrate 50, with ohmic metal contacts 62 and 64 located at the bottom and top of the AlGaAs-based semiconductor laser diode 48, respectively.

Upon the n+-GaAs substrate 50 is grown a n-AlGaAs cladding layer 52, having a nominal thickness of 1.5 μm and Al content of 35%. The n-AlGaAs cladding layer 52 is doped with materials, such as, Si or Sn, to a concentration from $10^{17}$ to $10^{19}$ atoms/cm$^3$, with a preferred density of $5 \times 10^{17}$ atoms/cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy or Atomic Layer-Epitaxy) which accomplish epitaxial layers of controlled thicknesses and dopings, may be equally employed.

In the active layer 54, light is produced as a result of the recombination of electrons and holes injected from the n- and p-cladding layers, respectively. Typically, the active layer 54 is composed of GaAs, having thicknesses ranging from 10 to 1000 Å, preferably 100 Å (in which case it is called a quantum-well active layer), whose bandgap is chosen to be smaller than that of the materials in the cladding layers, as is conventionally practiced. It should be noted that the active layer need not be composed of GaAs. It can be formed of any semiconductive material, such as InGaAs or AlGaAs, whose bandgap is chosen to be smaller than that of the materials in the n- and p-cladding layers. In addition, instead of a single quantum well, it can be composed of multiple quantum wells. As is conventional for quantum well lasers, another possibility is to surround the active layer by AlGaAs-based confinement layers whose bandgaps are larger than that of the active layer but smaller than that of the n- and p-cladding layers. The preferred method of growth of the active and confinement layers is also MBE or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

Figure 2:
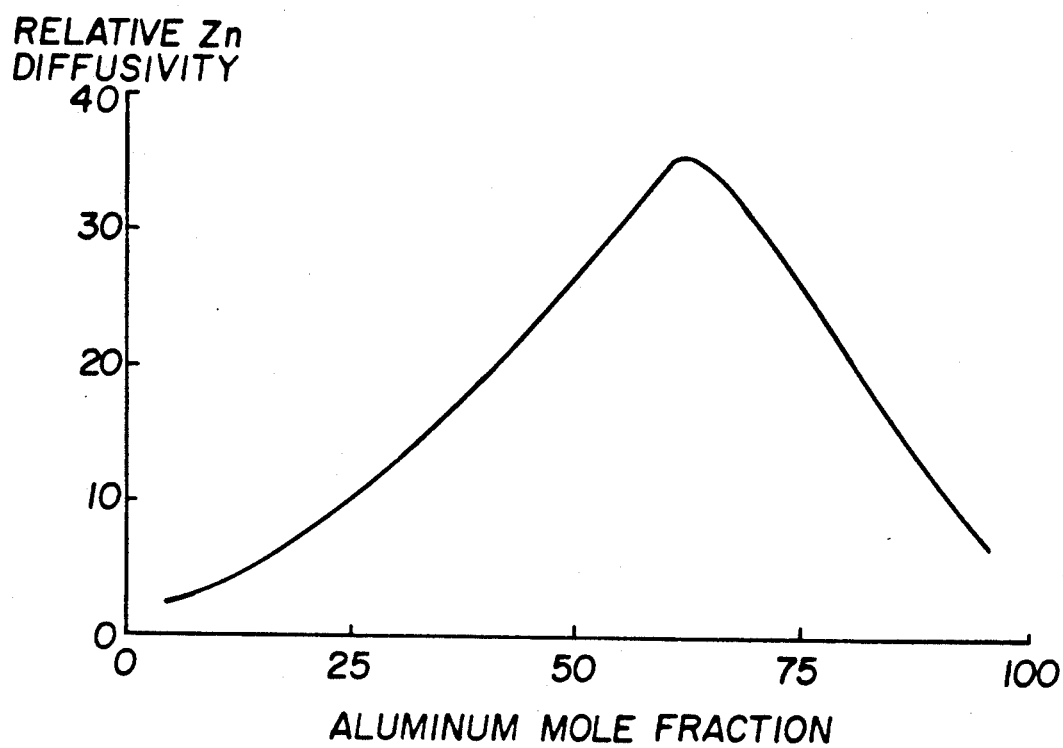
FIG. 2 depicts the Zn diffusion rate with respect to the Al content in AlGaAs.

Upon layer 54 is formed the p-AlGaAs Zn-stop diffusion layer, 56, followed by a p-AlGaAs cladding layer 58. The Al contents of these two layers range from 85 to 100% and 55 to 75%, respectively, with preferred values of 100 and 60%, respectively. Layers 54 and 56 have nominal thicknesses of 0.1 and 1.0 μm, respectively. Both layers are doped p-type with materials, such as, C, Be, or Zn, to a concentration from $10^{17}$ to $10^{19}$ atoms/cm$^3$, with a preferred density of $5 \times 10^{17}$ atoms/cm$^3$. It should be noted that the Zn-stop diffusion layer 56 need not be grown prior to the p-AlGaAs cladding layer; but, as is discussed above, it can be placed anywhere inside of the p-AlGaAs cladding layer without loss of laser performance. Since the p-cladding layer is composed of Al$_{0.60}$Ga$_{0.40}$As and the Zn-stop diffusion layer of AlAs, the Zn-stop diffusion layer has approximately a factor of 30 smaller diffusivity. (As indicated in FIG. 2, this reduction in diffusivity is at least comparable to the values obtained in the prior art.) This difference in diffusivity is more than sufficient to obtain the desired control of the Zn diffusion depth.

On the surface of layer 58 is formed a GaAs capping layer 60. Its thickness is typically 0.3 μm, while its conductivity can be either n- or p-type, preferably, n-type. As is practiced in the art, sometimes an n-AlGaAs blocking layer is grown on the p-AlGaAs cladding layer, prior to the deposition of the GaAs capping layer.

A Zn diffused region 66 is preferably formed by selectively depositing a source, such as, Zn-oxide, on the surface of the capping layer 60, followed by furnace annealing at 600 C for approximately 10 minutes. However, as is practiced in the art, the Zn diffused region 66 may be formed by many other methods. At best, it is preferred to have the Zn front stop just short of the active layer 54; however, the AlGaAs-based semiconductor laser diode will operate properly as long as the Zn front penetrates into the p-AlGaAs cladding layer. Following the Zn diffusion, electrically conductive ohmic metals 62 and 64, such as Au, are deposited on the GaAs substrate and capping layers, respectively.

Thus, there is provided by the present invention an AlGaAs-based semiconductor laser diode that employs a patterned Zn diffusion to obtain a selective low resistance path from the p-ohmic metal to the active layer. By virtue of the usage of a high Al-content Zn-stop diffusion layer in the structure, it becomes possible to control reproducibly the depth of the Zn front, without the concomitant loss of laser diode performance, as associated with the prior art. The ability to control the depth of the Zn front is highly desirable since it enables one to manufacture AlGaAs-based semiconductor laser diodes more reproducibly and with lower threshold currents.

Advantages

The usage of a high Al-content Zn-stop diffusion layer enables one to stop the Zn diffusion anywhere within the p-AlGaAs cladding layer, without loss of laser efficiency. Previous attempts at using low Al-content Zn-stop diffusion layers resulted in laser diodes with one or some of the following problems: higher active region current leakage, poor optical beam qualities, and lower optical confinement factors. In addition, using the results of the recent measurements of Smith, the effectiveness of the Zn-stop diffusion layer can be enhanced by choosing the p-AlGaAs cladding layer to have the highest Zn diffusivity and the Zn-stop diffusion layer to have a much smaller Zn diffusivity.

What is claimed is:

1. An AlGaAs-based semiconductor laser diode comprising:
   (a) a n+-GaAs semiconductor substrate;
   (b) a n-AlGaAs cladding layer deposited on the semiconductor substrate;
   (c) an active layer formed on the n-AlGaAs cladding layer;
   (d) a Zn-stop diffusion layer of p-type conductivity deposited on the active layer, having an Al content greater than 85%;
   (e) a p-AlGaAs cladding layer deposited on the Zn-stop diffusion layer, having an Al content between 55 and 75%, where such p-AlGaAs cladding layer has Zn diffused into it;

(f) a GaAs capping layer deposited on the p-AlGaAs cladding layer where such layer has Zn diffused into it; and (g) electrically conductive layers, deposited on the substrate and capping layers.

2. The AlGaAs-based semiconductor laser diode of claim 1 in which the Zn-stop diffusion layer is contained within the p-AlGaAs cladding layer.

3. The AlGaAs-based semiconductor laser diode of claim 1 in which the GaAs capping layer is n-type.

4. The AlGaAs-based semiconductor laser diode of claim 3 in which an n-type blocking layer is grown prior to the deposition of the GaAs capping layer.

5. The AlGaAs-based semiconductor laser diode of claim 1 in which the active layer is comprised of multiple-quantum wells.

6. The AlGaAs-based semiconductor laser diode of claim 1 in which Zn is diffused into the Zn-stop diffusion layer.

* * * * *